US008031093B2

(12) United States Patent
Li et al.

(10) Patent No.: US 8,031,093 B2
(45) Date of Patent: *Oct. 4, 2011

(54) REDUCED COMPONENT DIGITAL TO ANALOG DECODER AND METHOD

(75) Inventors: Kongning Li, Toronto (CA); Charles Leung, North York (CA); Grigori Temkine, Markham (CA); Milivoje Aleksic, Richmond Hill (CA); Steven Turner, Kettleby (CA); Greg Vansickle, Ottawa (CA); Kevin O'Neil, Toronto (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/439,265

(22) PCT Filed: Aug. 31, 2007

(86) PCT No.: PCT/IB2007/002654
§ 371 (c)(1),
(2), (4) Date: Feb. 27, 2009

(87) PCT Pub. No.: WO2008/026067
PCT Pub. Date: Mar. 6, 2008

(65) Prior Publication Data
US 2010/0013689 A1    Jan. 21, 2010

(51) Int. Cl.
*H03M 1/00* (2006.01)
*H03M 1/66* (2006.01)
(52) U.S. Cl. .................... 341/136; 341/154; 341/144
(58) Field of Classification Search ............ 341/136, 341/144, 154, 148; 345/204–215
See application file for complete search history.

(56) References Cited

U.S. PATENT DOCUMENTS

| | | | |
|---|---|---|---|
| 4,146,882 A | 3/1979 | Hoff et al. | |
| 4,667,178 A | 5/1987 | Ryu | |
| 5,065,159 A | 11/1991 | Kuwana | |
| 5,402,127 A | 3/1995 | Toda | |
| 5,416,482 A | 5/1995 | Ueki | |
| 6,181,265 B1 | 1/2001 | Lee | |
| 6,211,866 B1 * | 4/2001 | Okutani | 345/209 |
| 6,304,241 B1 | 10/2001 | Udo et al. | |
| 6,417,827 B1 | 7/2002 | Nagao et al. | |
| 7,277,036 B2 | 10/2007 | Otake | |
| 7,385,545 B2 | 6/2008 | Li et al. | |
| 2005/0017991 A1 | 1/2005 | Yamazaki et al. | |
| 2005/0231497 A1 | 10/2005 | Harada | |

FOREIGN PATENT DOCUMENTS

| | | |
|---|---|---|
| EP | 1184939 A | 3/2002 |
| EP | 1184989 A2 | 3/2006 |

(Continued)

OTHER PUBLICATIONS

Poynton, Charles, "Frequently Asked Questions About Gamma", Jan. 4, 1998, online, http://www.poynton.com/notes/colour_and_gamma/GammaFAQ.html.

(Continued)

*Primary Examiner* — Jean Jeanglaude
(74) *Attorney, Agent, or Firm* — Vedder Price P.C.

(57) ABSTRACT

An n bit D/A decoder is formed using P-type and N-type transistor switches, instead of convention CMOS switches. Each P-type and N-type switch may be formed of fewer transistors than those used to form a CMOS switch, thereby reducing the overall transistor count. The decoder may be used to decode digital values to non-linear GAMMA corrected analog output voltages.

27 Claims, 13 Drawing Sheets

FOREIGN PATENT DOCUMENTS

| | | | |
|---|---|---|---|
| JP | 63156410 | A | 6/1988 |
| JP | 02168708 | A | 6/1990 |

OTHER PUBLICATIONS

Allen, P.E. et al.; "CMOS Analog Design", 2nd ed., 2002. pp. 113-126, Oxford University Press, USA.

International Search Report from European Patent Office, International Appl. No. PCT/IB2007/002654; dated Mar. 19, 2008.

Chinese Patent Office Communication issued Feb. 16, 2011 in relation to Chinese Patent Application 2007800366251, filed Aug. 31, 2007.

* cited by examiner

US 8,031,093 B2

REDUCED COMPONENT DIGITAL TO ANALOG DECODER AND METHOD

RELATED APPLICATIONS

This application is a national filing of International Application No. PCT/IB2007/002654, filed on Aug. 31, 2007, entitled "REDUCED COMPONENT DIGITAL TO ANALOG DECODER AND METHOD", having as inventors Kongning Li et al., and owned by instant assignee, which claims priority to U.S. application Ser. No. 11/469,345 (now U.S. Pat. No. 7,385,545), filed Aug. 31, 2006, entitled "REDUCED COMPONENT DIGITAL TO ANALOG DECODER AND METHOD", having as inventors Kongning Li et al., and owned by instant assignee, the contents of which are hereby incorporated herein by reference.

FIELD OF THE INVENTION

The present invention relates generally to digital to analog (D/A) converters, and more particularly to digital/analog decoders that make use of P-type and N-type decoders, which can be used in a driver for an LCD/LED or similar display array.

BACKGROUND OF THE INVENTION

D/A converters/decoders have a wide variety of applications in modern electronics. Typically, a D/A converter provides an analog output corresponding to a digital input.

Display elements in modern displays, for example, are formed as two dimensional arrays of emissive elements, typically in the form of liquid crystals, light emitting diodes (LEDs), organic light emitting diodes (OLEDs), plasma cells or the like, surface conduction electrode-emitter displays (SEDs). Emissive elements are arranged in a two-dimensional array. Each element represents one pixel in the array, and may include one or more active components. For example color liquid crystal displays (LCDs) typically include at least three crystals per pixel, with each crystal representing one color component of the pixel. The three crystals, in combination with back lighting form the emissive element that can be used to display a pixel of arbitrary color.

As each display is made of a multitude of individual display elements, suitable drive circuitry is required. As each display element is typically formed with three color emitting components, the drive circuitry typically includes three separate driver elements for each pixel. Drive circuitry typically includes multiple D/A converters, each of which includes a digital decoder used to output suitable analog drive voltages or currents to drive the individual display elements. Typical D/A decoders are formed using a multitude of transistor switches to provide output analog voltages selected in dependence on a digital value to be decoded. One such design uses a complementary metal oxide semiconductor (CMOS) switches, requiring at least two transistors per switch.

As newer displays are significantly thinner and lighter than conventional CRT displays, they may be miniaturized and form part of a variety of electronic devices including televisions, computer monitors, and easily portable devices such as digital media players, mobile phones, personal digital assistants, MP3 players, and the like. In such devices reducing transistor count is desirable, as reduced transistor counts reduce power consumption.

More generally, integrated circuits and functional blocks of such integrated circuits with fewer transistors may be manufactured to consume less power and occupy less space.

Accordingly, a digital to analog decoder having fewer electronic components is desirable.

SUMMARY OF THE INVENTION

In accordance with an aspect of the present invention, an n bit D/A decoder is formed using P-type and N-type transistor switches, instead of convention CMOS switches. Each P-type and N-type switch may be formed of fewer transistors than those used to form a CMOS switch, thereby reducing the overall transistor count.

In one embodiment, an n bit D/A decoder includes an n−1 bit decoder formed using P-type transistors, such as p-channel metal oxide silicon transistors (PMOS), to provide output voltages above a first threshold; and an n−1 bit decoder formed of N-type transistors, such as n-channel metal oxide silicon transistors (NMOS), providing output voltages below a second threshold. The second threshold may be above the first. The PMOS and NMOS decoders are provided with n−1 bits of the decoder input. A switch, controlled by the remaining bit of the decoder selects whether the decoder outputs the output of the PMOS or NMOS decoder. Analog inputs to the NMOS and PMOS decoders are selected below and above the thresholds, so that only PMOS switches and NMOS switches need be used to form the PMOS and NMOS decoder, respectively. In comparison to CMOS switches, transistor count is reduced significantly.

Optionally, n bit inputs to be decoded may be conditioned (i.e. maninpulated) to ensure that digital values producing analog voltages above the second threshold are decoded by the PMOS decoder, and digital values producing analog voltages below the first threshold are decoded by the PMOS decoder. Voltages between the second and threshold may be decoded by either the NMOS or PMOS decoder. In one embodiment, for any digital input, a D/A decoder outputs a value above the first threshold and a value below the second threshold in alternate cycles of a clock. Input digital data is conditioned by an inverter in every alternate cycle of this clock. Optionally, different (but like polarity) analog voltages are provided to the D/A decoder in every alternate cycle.

In accordance with an aspect of the present invention, there is provided a method of converting an n-bit digital input signal into an analog output signal, comprising: selecting a first analog voltage from analog voltages above a first threshold using a plurality of p-type transistor switches, in dependence on said n-bit digital input signal; selecting a second analog voltage from analog voltages below a second threshold that is above said first threshold, using a plurality of n-type transistor switches, in dependence on said n-bit digital input signal; selecting as said analog output, one of the first analog voltage and said second analog voltage, in dependence on said n-bit digital input signal.

In accordance with another aspect of the present invention, there is provided a method of converting a digital value into an analog output signal, comprising: receiving said digital value as n bits; decoding n−1 of said bits using an n−1 bit PMOS decoder, to provide an analog PMOS decoder output signal having a value above a threshold voltage; decoding n−1 of said bits using an n−1 bit NMOS decoder, to provide an NMOS decoder output signal, having a value below said threshold; selecting one of said NMOS decoder output, and said PMOS decoder output signals to provide said analog output signal.

In accordance with another aspect of the present invention, there is provided a digital to analog decoder comprising: n inputs for receiving an n bits digital input; an n−1 bit PMOS decoder, to decode n−1 of said digital input to provide an analog PMOS decoder output signal having a value above a threshold voltage; an n−1 bit NMOS decoder, to decode n−1 of said digital input to provide an analog NMOS decoder output signal having a value below said threshold voltage; a selector for selecting one of said NMOS decoder output, and said PMOS decoder output signals to provide said analog output signal.

In accordance with yet another aspect of the present invention, there is provided a digital to analog decoder comprising p-type transistor and n-type transistor switches: n inputs for receiving an n bits digital input; a plurality of p-type transistor switches for selecting a first analog voltage from analog voltages above a first threshold in dependence on said n-bit digital input signal; a plurality of n-type transistor switches for selecting a first analog voltage from analog voltages below a second threshold that is above said first threshold, in dependence on said n-bit digital input signal; a selector for selecting one of said first and second analog voltages to provide said analog output signal.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention, FIG. 1 schematically illustrates a display, including LCD elements arranged in a two dimensional array.

DETAILED DESCRIPTION

Figure 1:
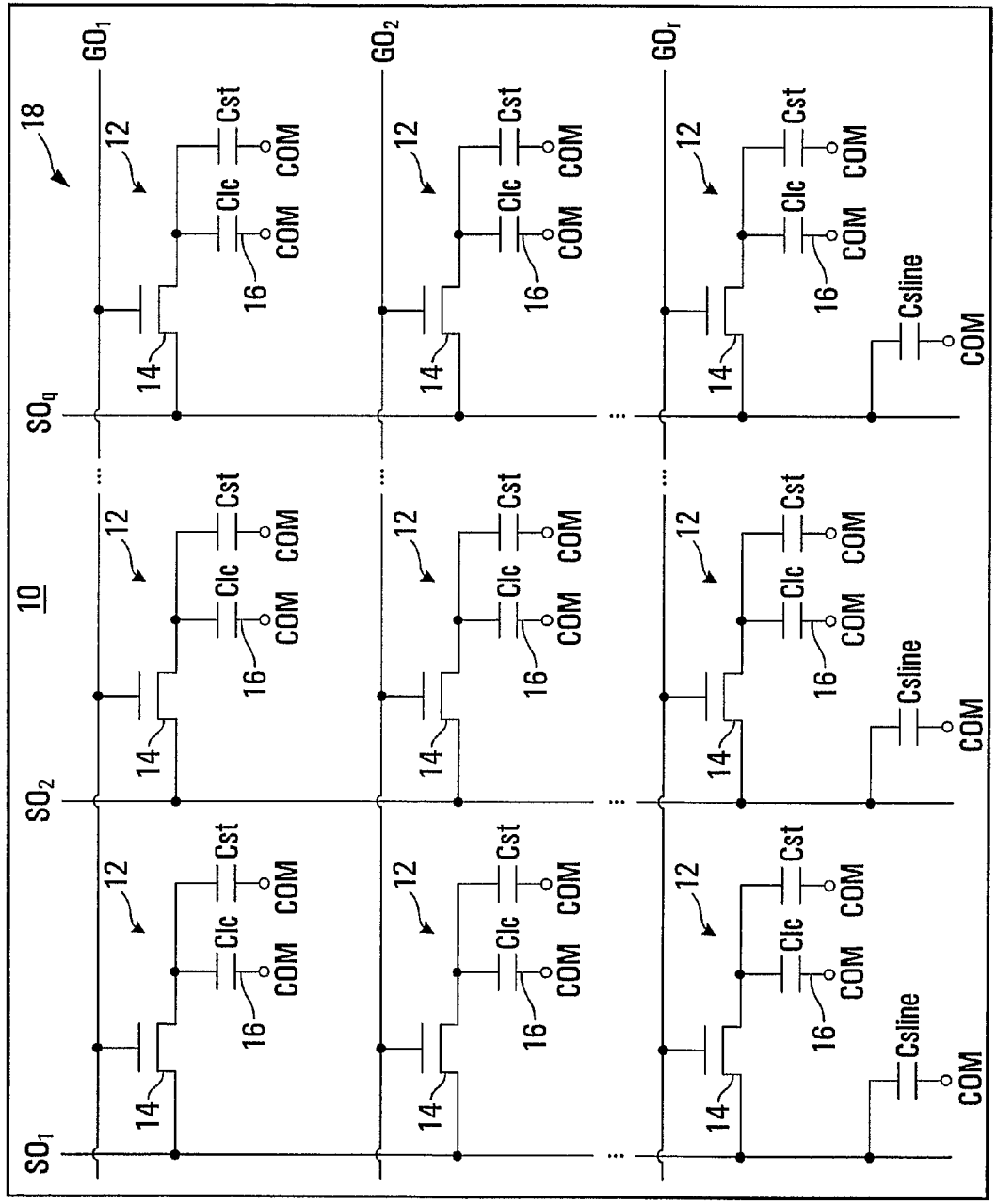

FIG. 1 is a partial schematic diagram of a conventional display 10 that may take the form of a liquid crystal display (LCD) panel. As illustrated a plurality of emissive elements 12 each including a thin film transistor (TFT) 14 and liquid crystals 16, are arranged in a two dimensional array 18. In the example embodiment, array 18 has size qxr. Example transistors 14 are field effect transistors (FETs). Source lines (SO) of transistors forming each element 12 within a column of the array 18 are interconnected. Similarly gate lines (GO) of the transistors within a row are interconnected. Each transistor is used to change the orientation of an interconnected liquid crystal 16, to vary the amount of light of particular color passed by the crystal. More specifically, an analog voltage at a source line (SO) in a currently active row changes the state of the associated liquid crystal 16. A row is made active by asserting the gate line (GO) common to that row. The liquid crystal 16 remains in its changed state for a finite duration, as a result of its inherent capacitance $C_{lc}$ and storage capacitor $C_{st}$. $C_{st}$ is connected in parallel with liquid crystal 16 to further increase the time liquid crystal 16 retains its state, as required. As noted, a display pixel is typically formed by three liquid crystals in close proximity, one of each to control the amount of red, green, and blue light, emitted by each element.

Figure 2:
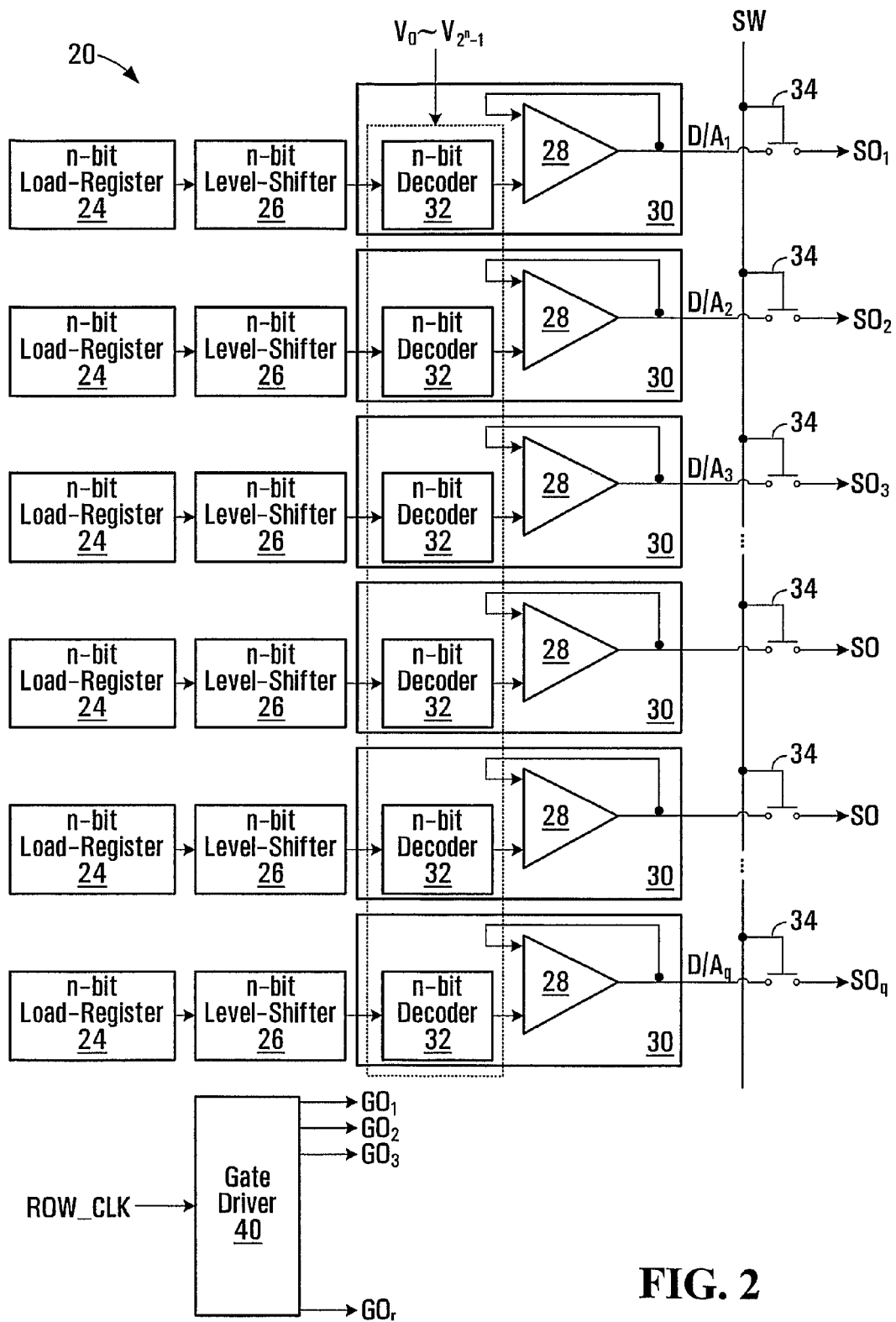
FIG. 2 is a block diagram of a conventional LCD driver, for driving the display of FIG. 1.

A driver 20, as illustrated in FIG. 2 may be used to drive all q source lines (SO) within a row of display 10, simultaneously. As illustrated driver circuit 20 includes q n-bit load registers 24 that each receives a data element representing a pixel in row of a two dimensional image, from a sampling register (not shown). Each n-bit load register 24 provides an output to an n-bit level shifter 26 which, in turn, feeds a digital to analog converter 30, including an n-bit decoder 32 and operational amplifier 28, acting as a buffer. Level shifter 26 shifts the digital voltage level of signals in register 24 to levels compatible with n-bit decoder 32. n-bit decoder 32 outputs an analog output signal, in the range $V_0 \sim V_{2^n-1}$ corresponding to the value of the n-bit input. As will become apparent, $V_0 \sim V_{2^n-1}$ may be chosen to provide non-linear, GAMMA corrected, reference voltages. Gamma correction generally is described in Charles Poynton's Gamma FAQ, available on the Internet at www.poynton.com/GammFAQ.html, the contents of which are hereby incorporated by reference.

Operational amplifier 28 acts as a buffer, and provides an isolated analog signal used to drive an interconnected source line (SO) of array 18. A switch 34 associated with each output, controls when the analog output is provided to the source line. A gate driver 40 is capable of asserting gate lines (GO) associated with each of the rows of array 18, and thus acts as row selector. Gate lines are asserted by applying a pre-determined voltage, thereby allowing current to flow from source to drain in the FETs of an associated row. As such, gate driver 40 has r outputs, each providing a fixed output when active, to drive an interconnected gate line $(GO_k)$ of array 28. Gate driver 40 is controlled by a clock input (ROW_CLK). On an edge of ROW_CLK, the output of the r outputs of gate driver 40, that is asserted advances.

In operation, gate driver 40, asserts gate lines $GO_j$ in a single row (see FIG. 1). A corresponding row of an image to be represented on display 10 having q data elements is read from memory (not shown) and provided to load registers 22. n-bit level shifters 26 shift the data in the load registers 22 and provide the shifted data to n-bit decoder 32 which in turn drives operational amplifier 28 to provide analog outputs $(D/A_1$ to $D/A_q)$ that drive the source line $(SO_1$ to $SO_q)$ for all source lines in a particular row. After a row of data has been provided to the source lines $(SO_1$ to $SO_q)$ of a currently asserted column, q new samples are provided to load registers 22 which in turn drive the next row of display elements, after the asserted gate line is advanced and switches 34 are again activated. This is repeated for all rows of the display.

As a result of capacitances $C_{lc}$ and $C_{st}$ associated with each liquid crystal 16, each display element 12 retains its state, while elements in the remaining r−1 rows of array 18 are refreshed by digital to analog converters 30 (i.e. about r cycles of ROW_CLK). As will now be appreciated, driver 20 includes an n-bit level shifter, n-bit decoder and operational amplifier for each display element in a row. To drive a q column (i.e. q×r) display, driver 20 thus includes q such level shifters, decoders and operational amplifiers.

Figure 3:
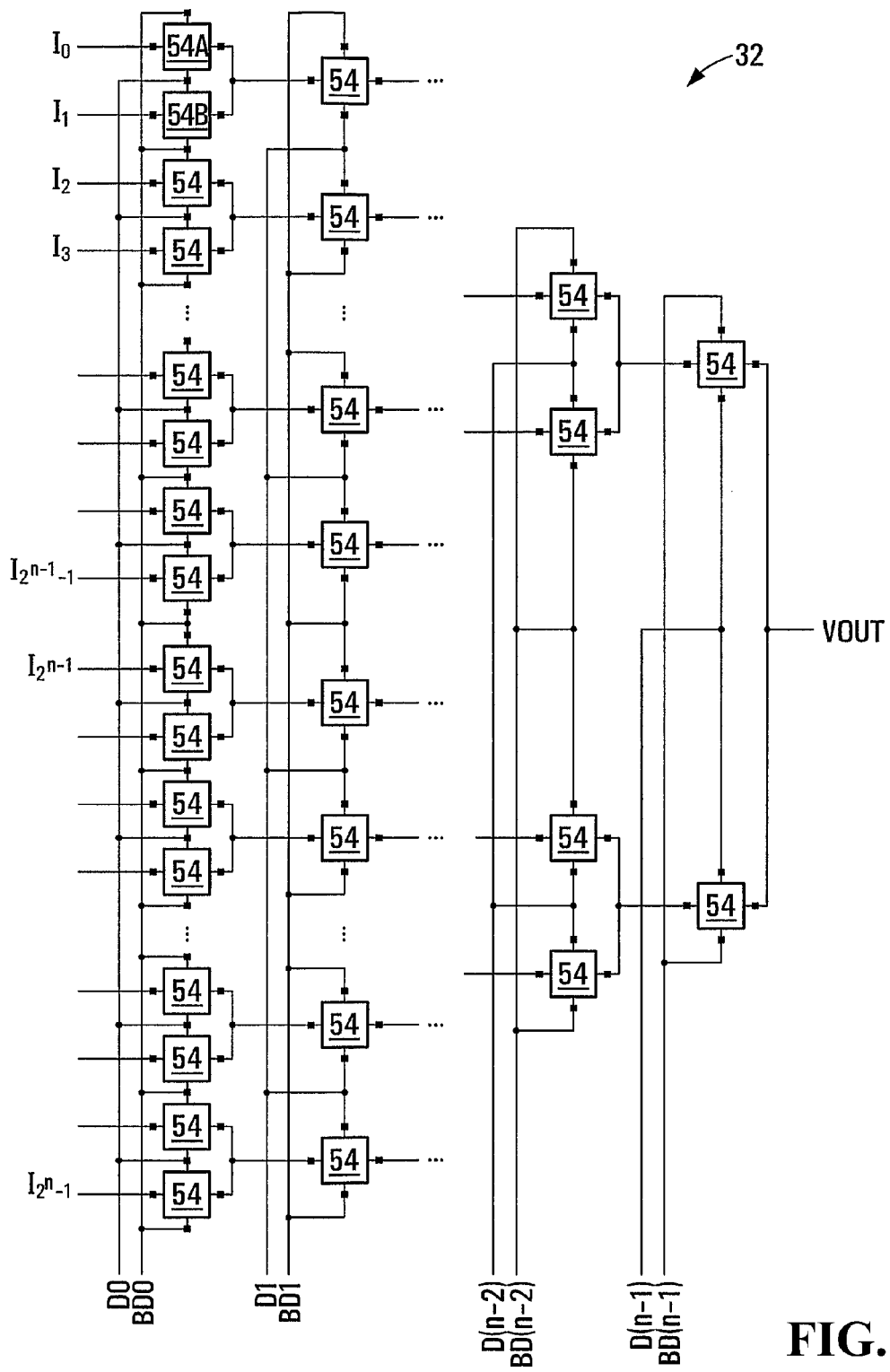
FIG. 3 is a block diagram of a conventional n-bit D/A decoder used in the LCD driver of FIG. 2.

FIG. 3 illustrates a conventional n-bit digital to analog decoder 32 that may be used to drive display elements, such as elements 12 of display 10 of FIG. 1. As illustrated, D/A decoder 32 receives an n-bit digital input D ($D_0$, $D_1$, $D_2$ ... $D_{n-1}$) and $2^n$ analog inputs at inputs $I_0$, $I_1$, $I_2$ ... $I_{2^n-1}$. Decoder 32 includes $2(2^n-1)$ analog switches 54, arranged in n columns. Each switch 54 has an analog input (IN), and an output (OUT). A control input (CON), and its inverse control input (BCON) controls whether the signal at INPUT is presented at its output. Adjacent analog switches 54 (e.g. switches 54a and 54b) in each column have their control inputs CON and BCON, interconnected in complement (with the control input CON of switch 54a connected to the inverse control input of switch 54b) and their outputs connected in parallel. In this way, two adjacent switches (e.g. switch 54a, 54b) act as a selector: the signal presented at the output OUT is the signal at the input of either of two transistor switches. For example either 10 provided to switch 54a or 11 provided to switch 54b, is presented at the output of the selector of switches 54a, 54b, in dependence on the control input CON (and its inverse BCON) of switches 54a, 54b.

Control inputs (CON) of every second transistor switch 54 in each column may be interconnected, to receive one bit ($D_0$, $D_1$ ... $D_{n-1}$) of the n bit digital data D. Control inputs (CON) of the remaining transistor switches 54 in each column may be interconnected, to receive one bit ($BD_0$, $BD_1$ ... $BD_{n-1}$) of the bit complement of the n bit digital data BD. BD may be formed using a suitable n bit inverter (not illustrated).

The output of four switches 54 in one column, feed the inputs of two switches 54 in the next column, also acting as a selector. In this way, the n control inputs allow the selection of any one of $2^n$ input voltages ($V_0$, $V_1$, $V_2$, ... $V_{2^n-1}$) presented at inputs $I_0$ to $I_{2^n-1}$ at D/A converter output $D/A_{out}$ of decoder 32

As each switch 54 is controlled by two complementary control inputs (CON. and BCON) when control input CON=1 ($V_H$) and BCON=0 ($V_L$), switch 54 will be turned on, when control input CON=0 ($V_L$) and BCON=1 ($V_H$), switch 54 will be turned off. Voltages $V_H$ and $V_L$ represent logic levels high and low, respectively. For example, $V_H$ may be the power supply voltage and $V_L$ may be ground.

Figure 4:
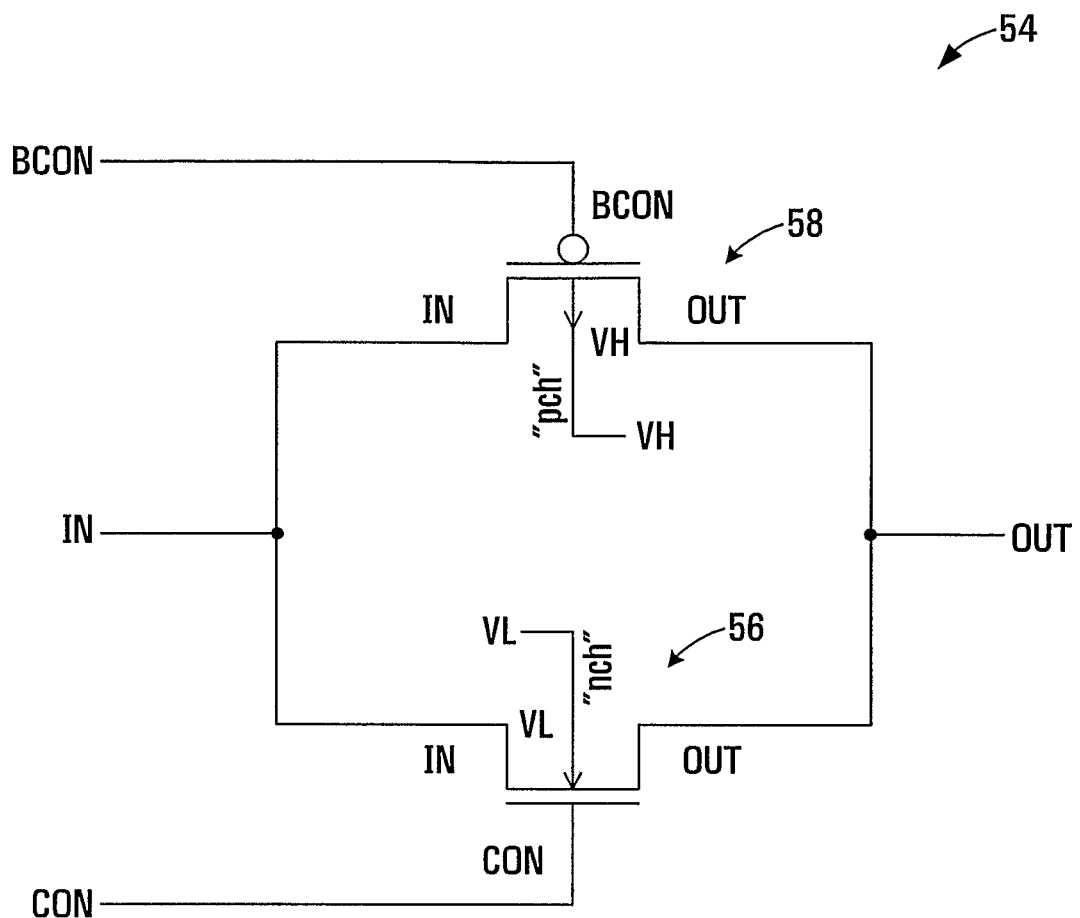
FIG. 4 is a schematic diagram of a CMOS transistor switch of the D/A decoder of FIG. 3.

Each switch 54 may be formed as a transistor switch. Typically, such transistor switches are formed using metal oxide semiconductor (MOS) transistors. A suitable MOS switch, for use as switch 54 is illustrated in FIG. 4. As illustrated, each switch 54 includes two MOS transistors 56, 58—one P-channel MOS (PMOS) transistor 56 and one N-channel MOS (NMOS) transistor 58, arranged back to back with the source of each transistor 56, 58, connected to the drain of the other transistor 56, 58. Such transistor interconnection provides a complementary MOS (CMOS) switch 54. CMOS and other MOS transistor switches are detailed in *CMOS Analog Design*, P. E. Allen, et al., Oxford University Press, USA; 2ed (Jan. 15, 2002), the contents of which are hereby incorporated by reference.

Figure 9:
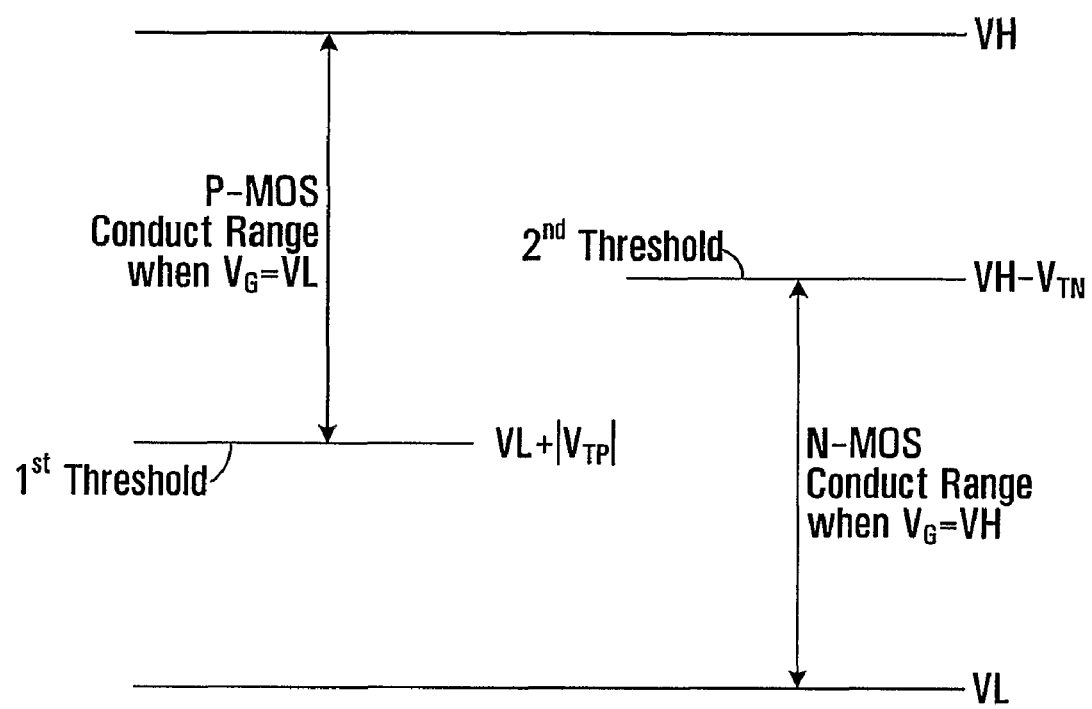
FIG. 9 illustrate threshold voltages to operate the transistor switches of FIGS. 4, 7 and 8.

CMOS switches 54 are used to ensure that there is no restriction of switch input (source) to control input (gate) voltages in the normal operating range of switch 54. Specifically, as will be appreciated by those of ordinary skill, a PMOS transistor 58, connected as a switch, completely conducts only if gate to source voltage is less than a voltage ($V_{TP}$) (i.e. $V_{GS}<V_{TP}$, for enhancement PMOS: $V_{TP}<0$). If $V_G=VL$, then the source voltage must exceed a first threshold to conduct i.e. $V_S>VL+|V_{TP}|$. An NMOS transistor, connected as a switch, completely conducts only if gate to source voltage is greater than a voltage ($V_{TN}$) (i.e. $V_{GS}>V_{TN}$, for enhancement NMOS: $V_{TN}>0$). If $V_G=VH$, then the source voltage must be less than a second threshold i.e. $V_S<VH-V_{TN}$. Connecting NMOS and PMOS transistors 56, 58 with sources to drains, ensures that at least one of the two transistors 56, 58 is conducting for all the input range of $V_{IN}=VL\sim VH$, if $V_{CON}=VH$ and $V_{BCON}=VL$ are applied to the gates of the NMOS and PMOS transistors 56, 58. Notably the second threshold voltage $V_S=VH-V_{TN}$ is typically larger than (or equal to) the first threshold voltage $V_S=VL+|V_{TP}|$, thus possibly creating a range of overlap in the operating voltages of transistors 56 and 58. The relationship of threshold voltages $V_S=VH-V_{TN}$ and $V_S=VL+|V_{TP}|$ to $V_L$ and $V_H$ are illustrated in FIG. 9.

As there is no restriction on voltage of individual switches 54, there is also no restriction on the voltage inputs $V_0$, $V_1$ ... $V_{2^N-1}$ of decoder 32 (FIG. 3), within the range of normal operating voltages (e.g. between $V_L$ and $V_H$) of switches 54. However, as each switch 54 requires two transistors 56, 58, an n bit decoder 32 will typically require at least $4(2^n-1)$ transistors. Thus for a 6 bit D/A converter/decoder a total of at least 252 transistors are used to form D/A decoder like 32. In fact, as detailed below, an area-saving design of decoder 32 typically needs more than this number of transistors.

Figure 6:
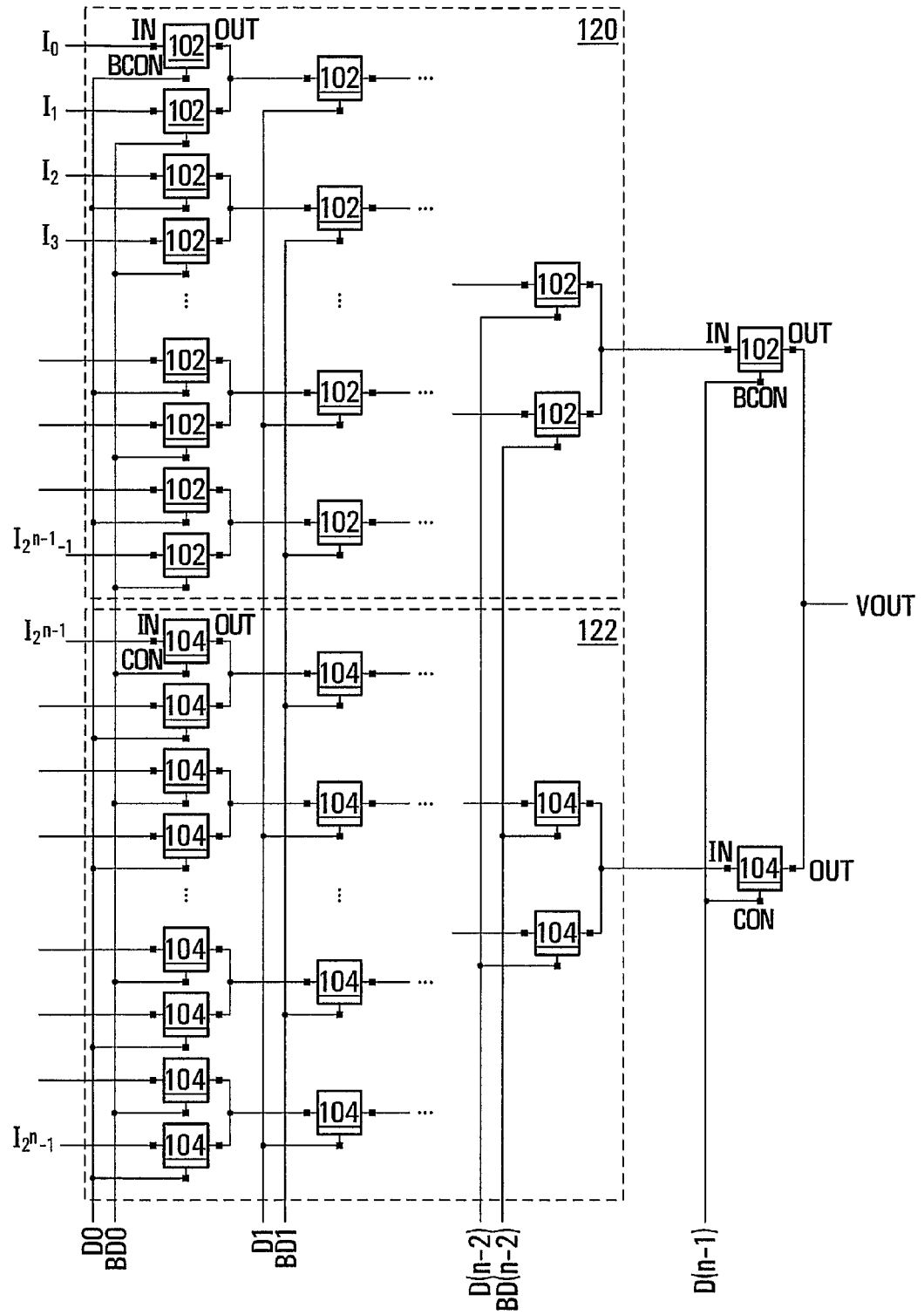
FIG. 6 is a block diagram of an n-bit D/A decoder, exemplary of an embodiment of the present invention.
Figure 7:
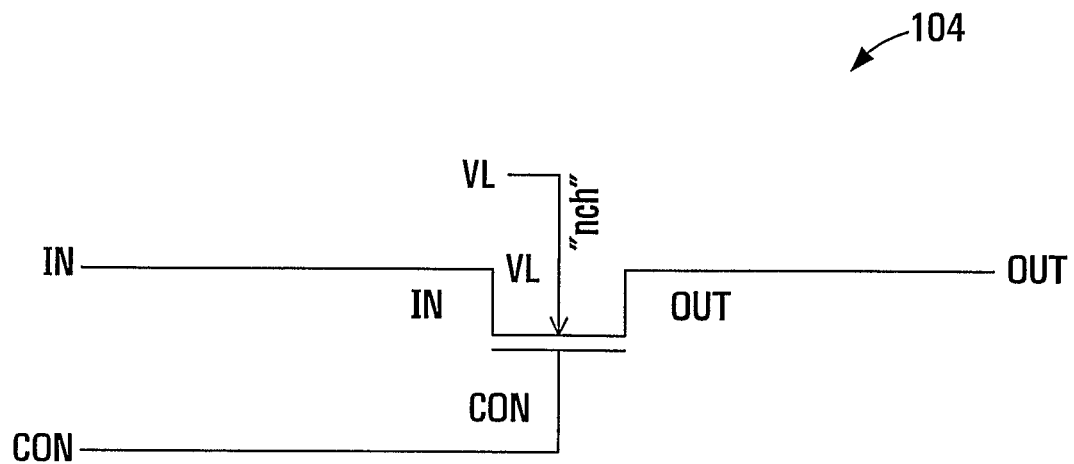
FIGS. 7 and 8 are schematic diagrams of NMOS and PMOS transistor switches of the decoder of FIG. 6.
Figure 8:
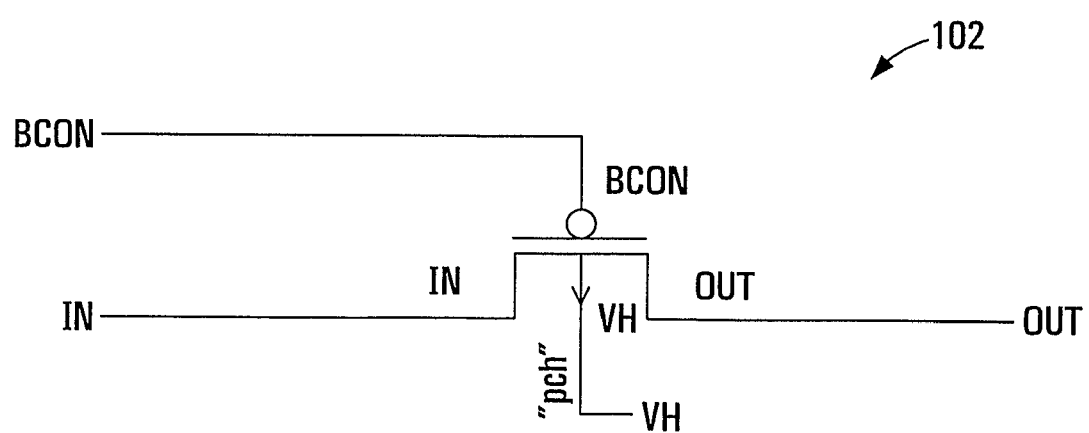

Exemplary of an embodiment of the present invention, a D/A decoder 100 is formed primarily with P-type (e.g. PMOS) transistor switches 102 and N-type (e.g. NMOS) transistor switches 104, as illustrated in FIG. 6. Individual NMOS and PMOS transistor switches of the decoder of FIG. 6 are illustrated in FIGS. 7 and 8, respectively. PMOS transistors switches 102 are only able to switch voltages equal to, or above the first threshold, $V_S=VL+|V_{TP}|$, while NMOS transistor switches 104 can only switch input voltages below the second threshold $V_S=VH-V_{TN}$, as illustrated in FIG. 9.

As illustrated in FIG. 6, PMOS switches 102 form a n−1 bit PMOS D/A decoder 120 serves for the analog inputs $I_0\sim I_{2^{n-1}}$ with levels above $VL+|V_{TP}|$. NMOS switches 104 similarly form a n−1 bit NMOS D/A decoder 122 for analog inputs $I_{2^{n-1}}\sim I_{2^n-1}$ with levels below $VH-V_{TN}$. As will be appreciated, each D/A decoder 120, 122 is formed of $2^{n-1}+2^{n-2}+2^{n-3} ... +2$ switches=$2^n-2$ switches. Outputs of decoder 120 and decoder 122 may be combined using a selector formed of PMOS switch 124 and an NMOS switch 126.

As should now be apparent, D/A decoder 100 is best suited for providing $2^{n-1}$ analog output voltages (corresponding to $2^{n-1}$ unique digital inputs) above $VL+|V_{TP}|$, and $2^{n-1}$ analog voltages (corresponding to the remaining $2^{n-1}$ unique digital inputs) below $VH-V_{TN}$. Input voltages above $VL+|V_{TP}|$ could be decoded by PMOS decoder 120 and voltages below $VH-V_{TN}$ could be decoded by NMOS decoder 122.

In order to avoid burn-in of LCD display elements 12, the applied voltage to each liquid crystal is periodically changed. That is, for the same input digital data D, a liquid crystal 16 should be charged with different levels of source line output. To this end, a polarity control signal POL_CLK may control which of two voltages are applied for a digital value D. For example, when POL_CLK=0, the source line output $V^+(D)$ and the common electrode of all elements 12 are set to $V_{COM}=V_{COML}$; when POL_CLK=1, the source line output $V^-(D)$ and the common electrode of all elements 12 are set to $V_{COM}=V_{COMH}$, with $V^+(D)-V_{COML}=V_{COMH}-V^-(D)$ as required.

Figure 5:
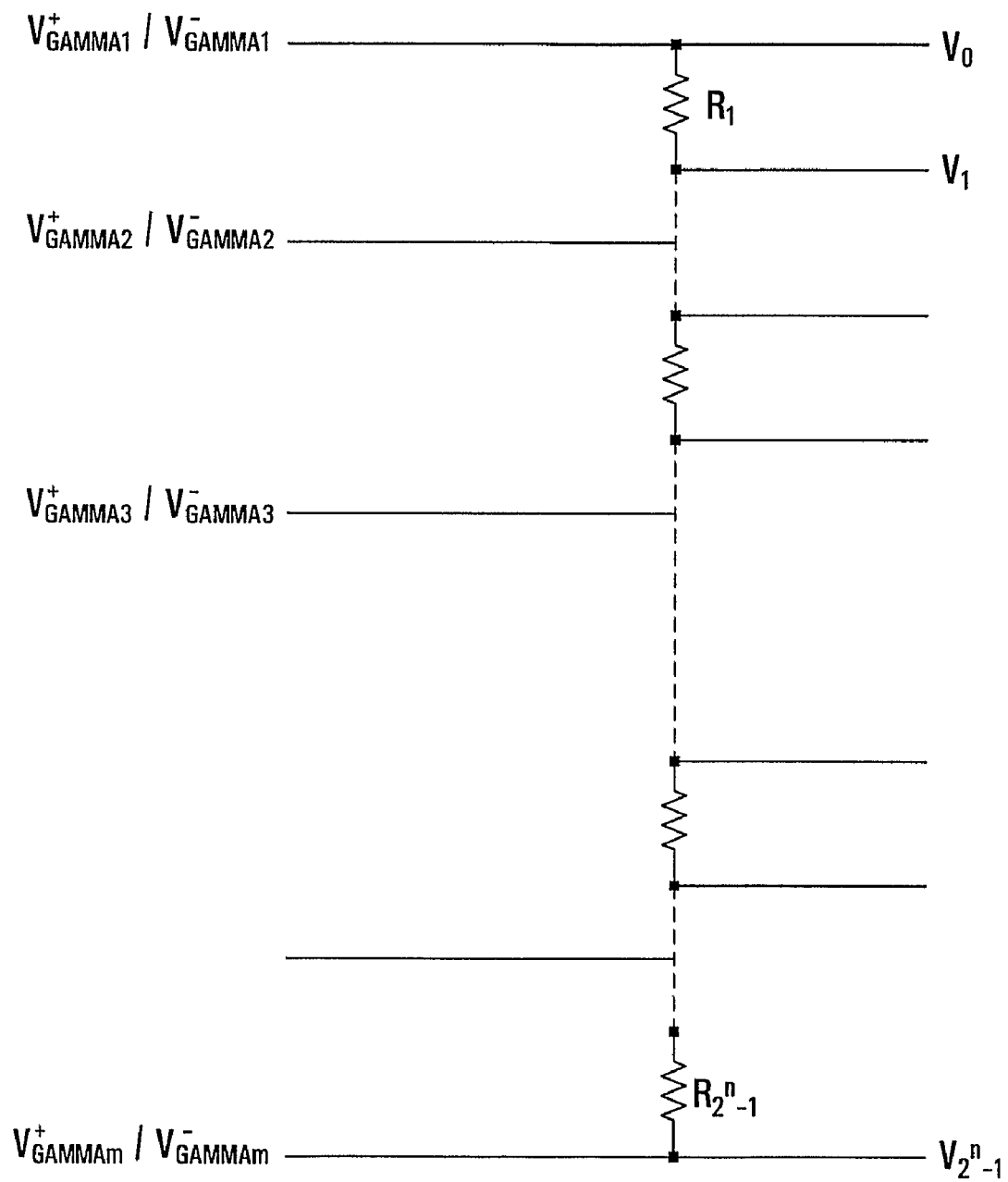
FIG. 5 is a schematic diagram of a resistor network used to provide $2^n$ of analog voltage levels with m levels of GAMMA correction for the n-bit decoder of FIG. 3.

For a conventional LCD driver (FIG. 3), typically, suitable voltages $V_0$, $V_1$, ... $V_{2^n-1}$ are provided to display using D/A decoder 32 by applying a set of gamma corrected input voltages $\{V^+_{GAMMA}\}=\{V^+_{GAMMA1}, V^+_{GAMMA2}, ... V^+_{GAMMAm}\}$ or $\{V^-_{GAMMA}\}=\{V^-_{GAMMA1}, V^-_{GAMMA2}, \ldots V^-_{GAMMAm}\}$) to a resistor network 62, as shown in FIG. 5. A plurality of resistors 64, in network 62 act as voltage dividers to provide $V^+_0$ to $V_{2^n-1}^+$ (or $V^-_0$ to $V_{2^n-1}^-$) to decoder 32. Two sets of gamma corrected input voltages $\{V^+_{GAMMA}\}$ or $\{V^-_{GAMMA}\}$ may be provided, so that voltages of oscillating values ($V^+_0/V^-_0$ to $V_{2^n-1}^+/V_{2^n-1}^-$) may be applied to each crystal 16 of element 12 (FIG. 1).

The voltages of the applied voltages oscillate depend on the level of polarity clock signal (POL_CLK). Specifically, when POL_CLK=0, $\{V^+_{GAMMA}\}$ is applied; when POL_CLK=1, $\{V^-_{GAMMA}\}$ is applied. Each digital value, applied at inputs $D_0$ to $D_{N-1}$(D) of converter 52 may thus produce two differing voltages at $D/A_{out}$, $V^+$(D)/$V^-$(D) depending on the particular polarity clock cycle. Of note, as each $V^+/V^-$ pair corresponds to the same colour/intensity, $V^+_{GAMMA1} > V^+_{GAMMA2}, \ldots > V^+_{GAMMAm}$, and $V^-_{GAMMA1} < V^-_{GAMMA2}, \ldots V^-_{GAMMAm}$. $V^+_{GAMMAm}$ and $V^-_{GAMMAm}$ are related by $V^+_{GAMMAm} + V_{COML} = V_{COMH} - V^-_{GAMMAm}$. In the depicted embodiment, $V^+_{GAMMAj} + V_{COML} = V_{COMH} - V^-_{GAMMAj}$. Changing the value of $\{V^+_{GAMMA}\}$ and $\{V^-_{GAMMA}\}$ adjusts the nonlinearity of the D/A converter with $V^+$(D)$-V_{COML} = V_{COMH} - V^-$(D).

D/A decoder 100 is thus well suited for generating some analog voltages used to drive display 10, and may have a multitude of other uses understood by those of ordinary skill. However, as noted above, to drive a conventional LCD array, each data input D corresponds to two voltages—at two different voltages, depending on the current polarity clock (POL_CLK) cycle. Hence, decoder 100 cannot be used as a replacement for decoder 32.

That is, merely applying voltages $V^+/V^-$ as in decoder 32 of FIG. 3 using network 62 of FIG. 5 would not work, as voltages applied to inputs $I_0, I_1 \ldots I_{2^{n-1}-1}$ (i.e. $V_0, V_1, V_2 \ldots V_{2^{n-1}-1}$) must remain above $VL+|V_{TP}|$, while voltages applied to inputs $I_{2^{n-1}}, I_{2^{n-1}+1} \ldots I_{2^n-1}$ (i.e. $V_{2^{n-1}}, V_{2^{n-1}+1} \ldots V_{2^n-1}$) must remain below $VH - V_{TN}$.

Accordingly, exemplary of an embodiment of the present invention, $\{V^+_{GAMMA}\}=\{V^+_{GAMMA1}, V^+_{GAMMA2}, \ldots V^+_{GAMMAm}\}$ or $\{V^-_{GAMMA}\}=\{V^-_{GAMMA1}, V^-_{GAMMA2}, \ldots V^-_{GAMMAm}\}$ with $V^+_{GAMMA1} > V^+_{GAMMA2}, \ldots > V^+_{GAMMAm}$ and $V^-_{GAMMA1} > V^-_{GAMMA2}, \ldots > V^-_{GAMMAm}$ are selected, and applied to a resistor ladder in alternate cycles of a polarity clock (POL_CLK), to generate in $V^+_0$ to $V_{s^n-1}^+$ and $V^-_0$ to $V_{2^n-1}^-$ at inputs $I_0$ to $I_{2^n-1}$ of decoder 100. At the same time, as required, data may be conditioned in alternate polarity clock cycles of clock 130 to ensure that digital inputs providing output voltages above $VL+|V_{TP}|$ are consistently decoded by PMOS decoder 120 and digital inputs providing output voltages below $VH - V_{TN}$ are decoded by NMOS decoder 122.

Figure 10:
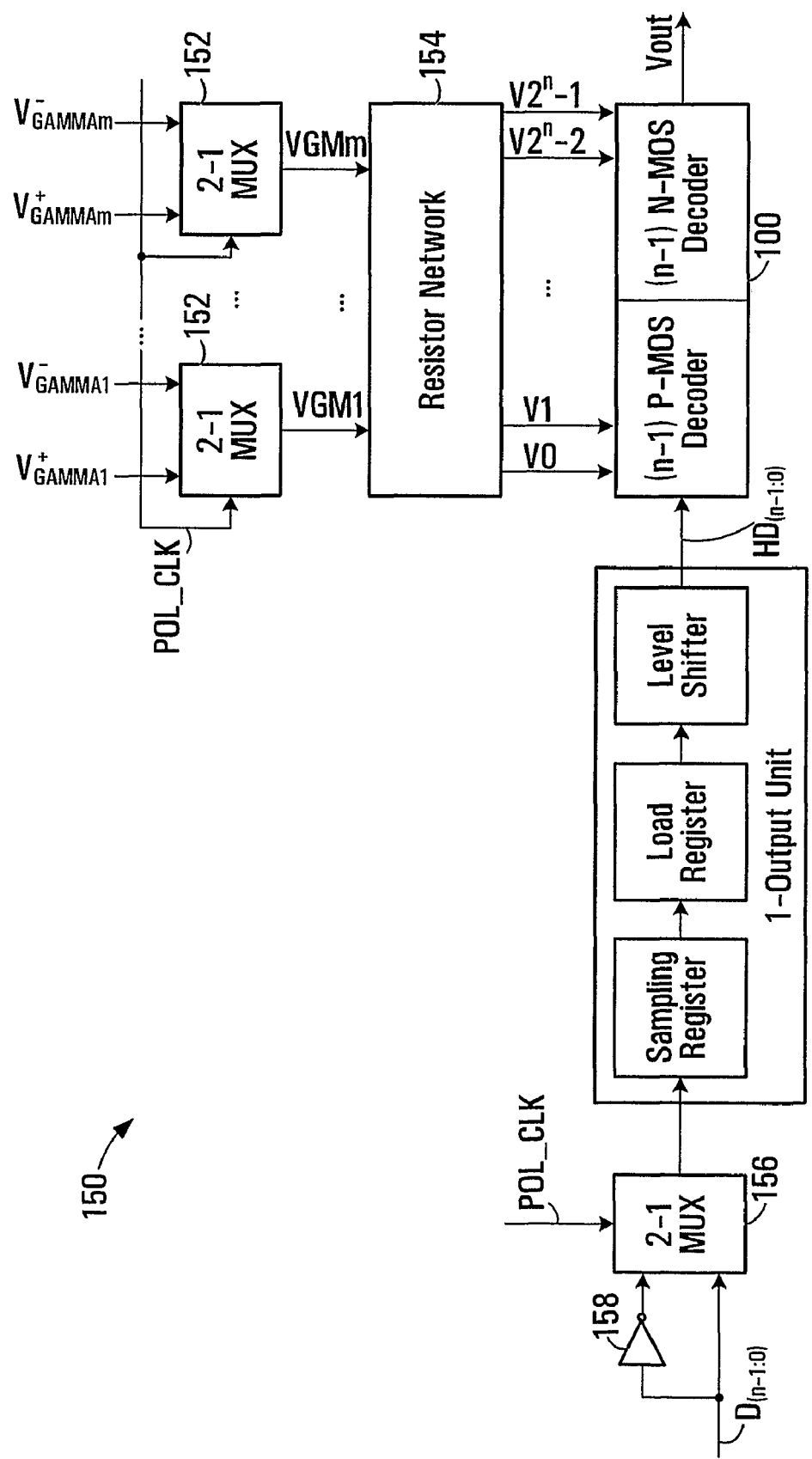
FIG. 10 is a schematic block diagram of a portion of a LCD driver for driving a display, like the display of FIG. 1, exemplary of an embodiment of the present invention.

In the depicted embodiment, a circuit 150 including logic to switch between sets $\{V^+_{GAMMA}\}$ and $\{V^-_{GAMMA}\}$ is illustrated in FIG. 10. As illustrated, m multiplexers 152 are used to select voltages in $\{V^+_{GAMMA}\}$ or $\{V^-_{GAMMA}\}$ to provide these to the m inputs of a resistor network 154 (like resistor network 60—FIG. 5), acting as a voltage divider. Network 154 in turn provides set $\{V_0^+, V_1^+, \ldots, V_{2^n-1}^{30}\}$ or $\{V_0^-, V_1^-, \ldots, V_{2^n-1}^-\}$ to analog inputs $I_0, I_2, \ldots, I_{2^n-1}$ of decoder 100 respectively.

A further multiplexer 156, chooses between D and its bit-complement $\overline{D}$ (output by inverter 158) to provide this to the digital input of converter 100 (by way of sampling register, load register, and level shifter like load register 24, and level shifter 26 of FIG. 2). Multiplexers 152 and 156 are clocked by polarity clock signal POL_CLK.

When POL_CLK=0, multiplexer 152 chooses $\{V^+_{GAMMA}\}$ as its output, multiplexer 156 chooses $\overline{D}$ as its output, and result in $\overline{D}$ as the Data bit input and $\{V_0^+, V_1^+, \ldots, V_{2^n-1}^+\}$ as the analog input $I_0, I_2, \ldots, I_{2^n-1}$ of decoder 100. When POL_CLK=1, multiplexer 152 chooses $\{V^-_{GAMMA}\}$ as its output, multiplexer 156 chooses D as its output, and result in D as the Data bit input and $\{V_0^-, V_1^-, \ldots, V_{2^n-1}^-\}$ as the analog input $I_0, I_2, \ldots, I_{2^n-1}$ of decoder 100. Thus, for a input data D, when POL_CLK=0, the output of decoder is $V_m^+$, where m = $\overline{D}$ and $V_{COM}=V_{COML}$; When POL_CLK=1, the output of decoder is $V_m^-$, where m=D and $V_{COM}=V_{COMH}$. Then although $V_0^+ > V_1^+ > \ldots > V_{2^n-1}^+$ and $V_0^- > V_1^- > \ldots > V_{2^n-1}^-$, $V^+(D) - V_{COML} = V_{COMH} - V^-(D)$ could be realized. In this way, by inverting the bits of the data D, output voltages above $VL+V_{TP}$ (whether for set $\{V^+_{GAMMA}\}$ or $\{V^-_{GAMMA}\}$) could be switched through decoder 120, while output voltages below $VH - V_{TN}$ could be switched through decoder 122.

In fact, as voltages above $VL+|V_{TP}|$ and below $VH-V_{TN}$ have a range of overlap (illustrated in FIG. 9). In order to decode digital data in the range of 0 to $2^n-1$ for analog output range of VL~VH, two sets of analog input voltages are provided to the inputs of PMOS and NMOS decoders, in order to ensure digital inputs providing output voltages above $VH-V_{TN}$ are consistently decoded by PMOS decoder 120, digital inputs providing output voltages below $VL+|V_{TP}|$ are consistently decoded by NMOS decoder 122, and digital inputs providing output voltages between $VL+|V_{TP}|$ and $VH-V_{TN}$ may be decoded by the PMOS decoder 120 or NMOS decoder 122.

The voltage outputs of network 60 (or network 154) are further illustrated in FIG. 5. As illustrated, the $i^{th}$ output of network 154, after application of set $\{V^+GAMMA\}$ is the analog voltage $V^+_i$ corresponding to a positive cycle of POL_CLK=0, and after application of set $\{V^-_{GAMMA}\}$ the $i^{th}$ output of ladder 154 corresponds to the analog voltage $V^-_i$ corresponding to a negative cycle of POL_CLK=1. $\{V^+_{GAMMA}\}$ and $\{V^-_{GAMMA}\}$ are reference levels for specific GAMMA corrected nonlinear digital to analog conversion, corresponding to a GAMMA curve, and may be chosen, to match a specific display.

As will also be appreciated, the above described decoder will have numerous applications, including in a display driver as disclosed, or in other display drivers, or in other circuits/devices requiring digital to analog conversion including non-linear digital to analog conversion. Converters operating with other suitable operating threshold voltages and $V_{TP}$, $V_{TN}$ values may be easily formed.

Figure 11:
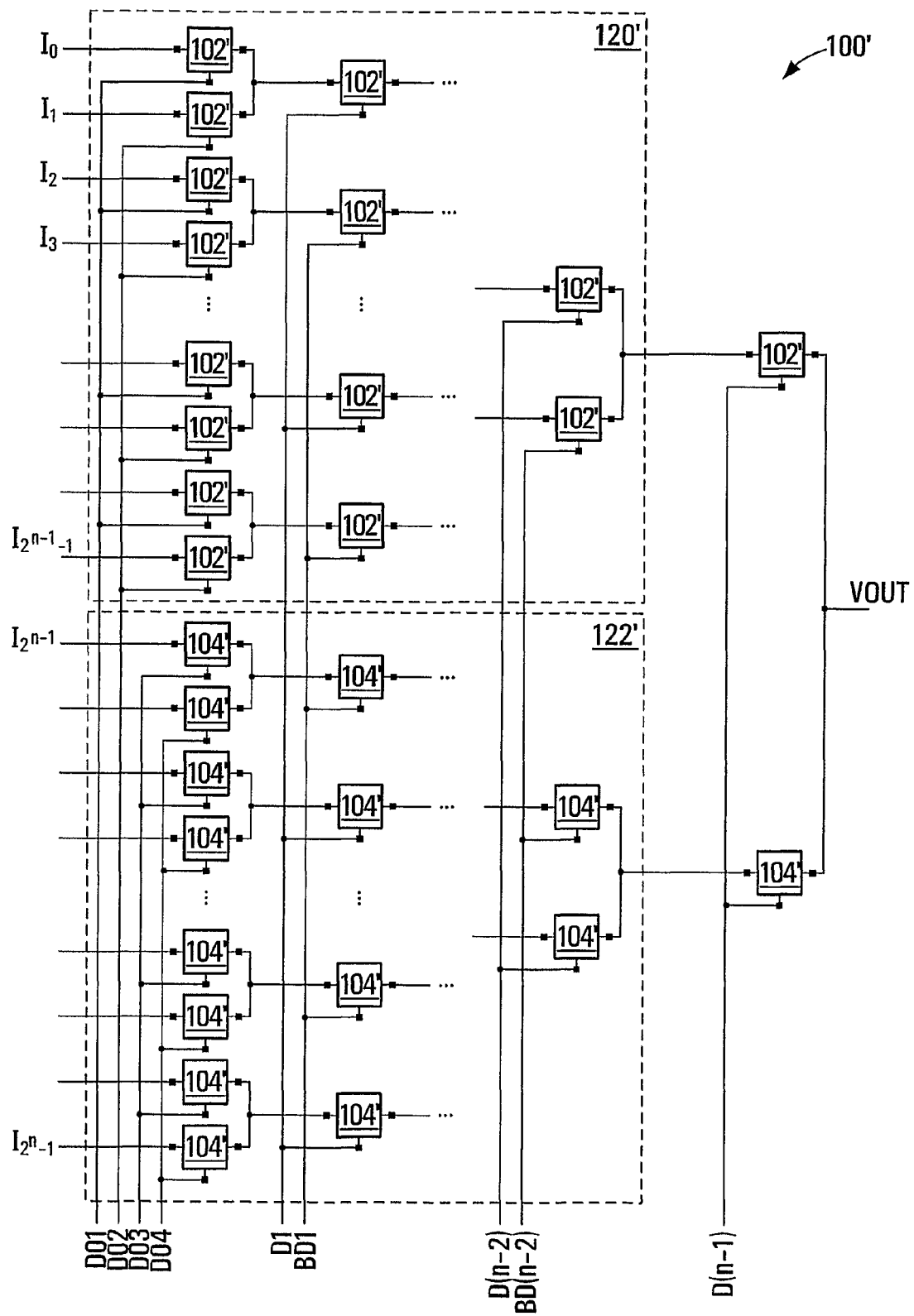
FIG. 11 is a block diagram of further n-bit D/A decoder, exemplary of another embodiment of the present invention.

Decoder 100 may be further modified to consume less power, by effectively powering down PMOS decoder or NMOS decoder when not in use. FIG. 11 illustrates a modified decoder 100' in which switches 102' in the first column of N-type D/A decoder 120' (like decoder 120) or switches 104' in the first column of P-type decoder 122' (like decoder 122) may be all turned off using one or more additional control inputs. Specifically, instead of using bit D0 (and its complement (BD0)) to control switches 102' in the first columns of N-type decoder 120' and P-type decoder 122' four control inputs D00, D01, D02 and D04 are used. Control inputs D00 and D01 are used to control N-type decoder 120', and control inputs D02 and D03 are used to control P-type decoder 122'. Conveniently, control inputs D00 and D01 may be used to shut-off transistors 102' in the first column of N-type decoder 120', or to switch analog voltages. Similarly, control inputs D02 and D03 may be used to shut-off transistors 104' in the first column of P-type decoder 122', or to switch analog voltages. Thus, control inputs D00, D01 may be used to substantially power down decoder 120', and control inputs D02 and D03 may be used to substantially power down decoder 122'. Conveniently, transistors 102' in the first column of each of decoders 102', 104', may be shut off in dependence on the most significant bit (MSB) of the data D being decoded. In this way, the n−1 bit decoder 120' or 122' that is currently not in use is effectively shut-down. Applied voltages at the inputs of the shut-off decoder 120' or 122', and associated currents, do not propagate beyond the first column of transistors 102' or 104', as the case may be.

Figure 12:
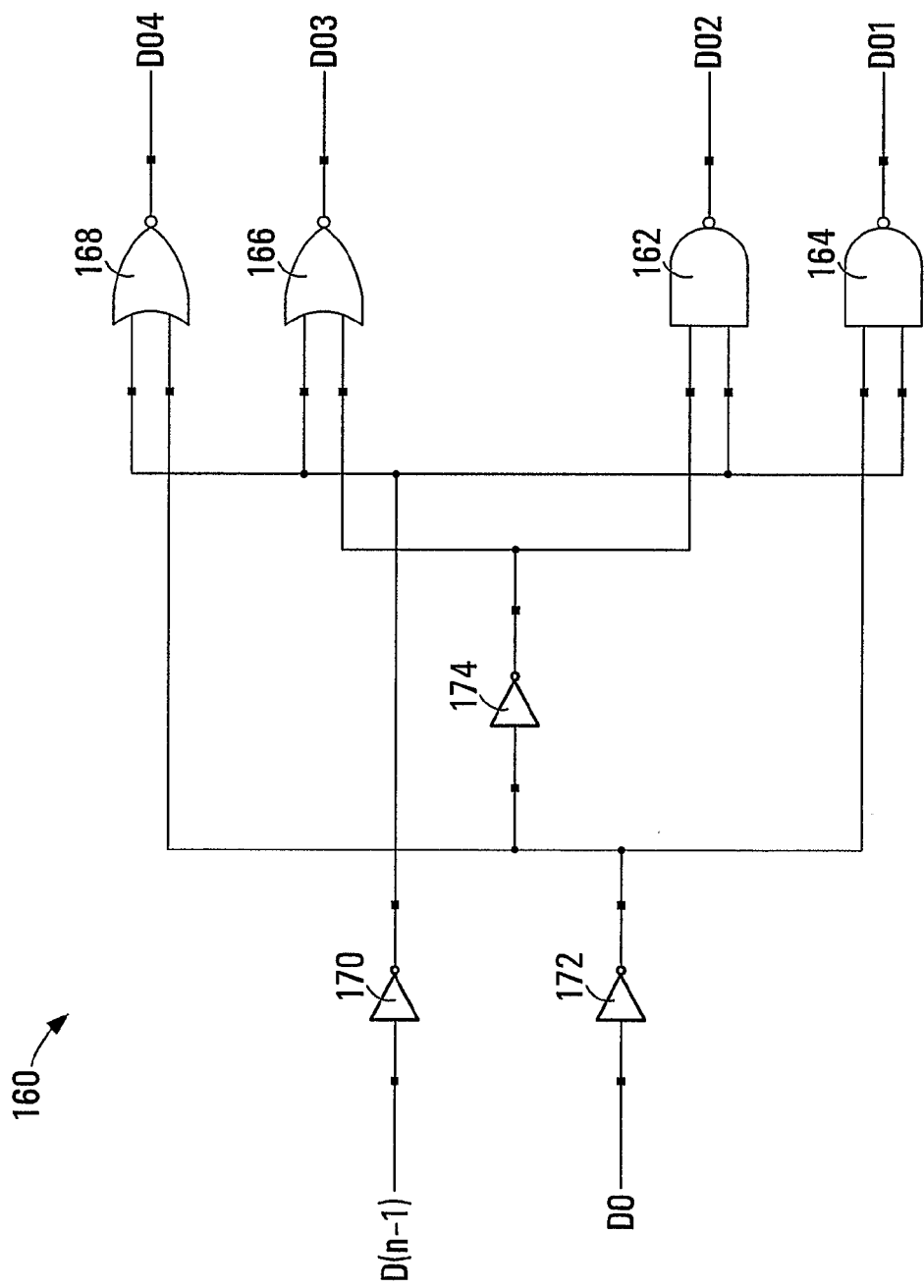
FIG. 12 is a schematic block diagram of control logic for data-bits used in the D/A decoder of FIG. 10.

A logic circuit 160 that may be used to decode the MSB and least significant bit (LSB) of data D is illustrated in FIG. 12 that may then be used to drive control inputs D01, D02, D03 and D04. As illustrated, two NAND gates 162, 164, two NOR gates 166, 168 and three inverters 170, 172 and 174 are provided in order to decode the LSB, D0, and the MSB, $D_{n-1}$, as illustrated in TABLE I.

TABLE I

| $D_{n-1}$ | $D_0$ | D01 | D02 | D03 | D04 |
|---|---|---|---|---|---|
| 0 | 0 | 0 | 1 | 0 | 0 |
| 0 | 1 | 1 | 0 | 0 | 0 |
| 1 | 0 | 1 | 1 | 1 | 0 |
| 1 | 1 | 1 | 1 | 0 | 1 |

Figure 13:
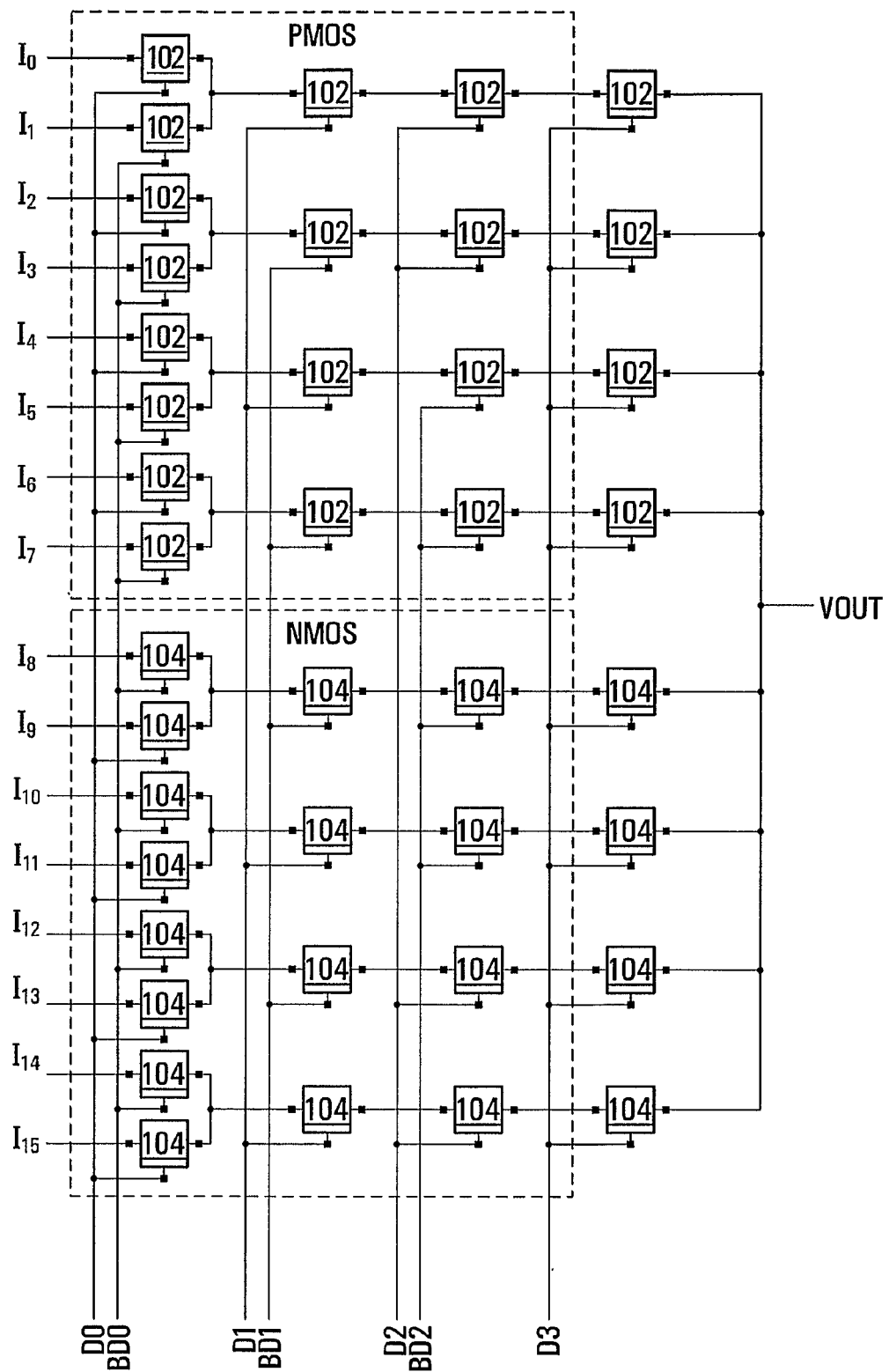
FIGS. 13 and 14 are schematic block diagrams of alternate D/A decoders, exemplary of embodiments of the present invention.
Figure 14:
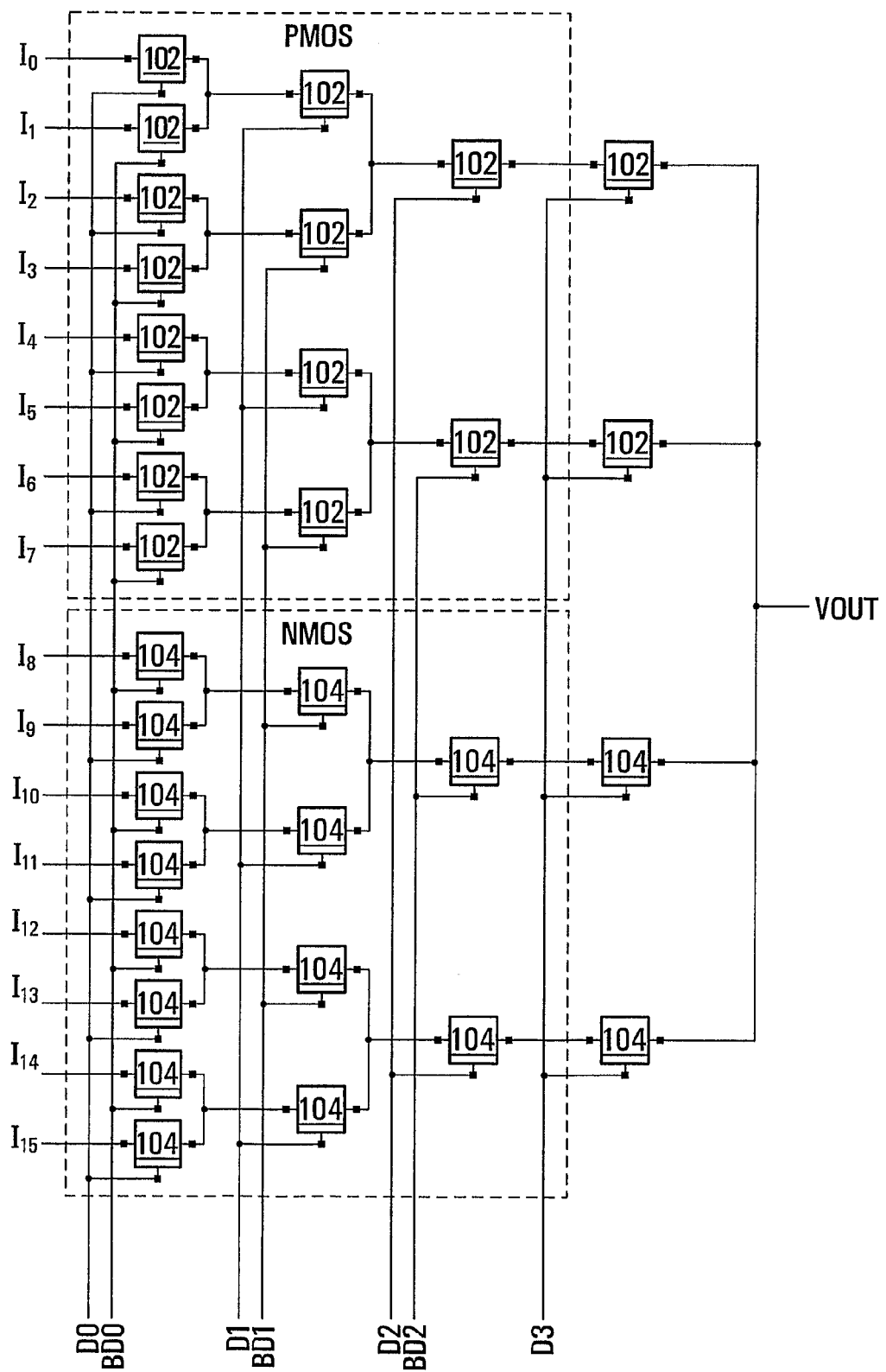

Example decoders 100 and 100' include columns having $2^1+2^2+\ldots+2^n$ transistor switches. Many other switch/column arrangements are possible. For example, to conserve area, reduce transistor fan out and provide drive strength, 4-bit decoder could be constructed with $2^3(1+1+1+2^1)$ switches as depicted in FIG. 13 or $2^2(1+1+2^1+2^2)$ switches as depicted in FIG. 14. Of note, the selector used to select between P-type and N-type (n−1) bit decoders is formed of multiple p and n type switches. For example, the selector of FIG. 13, driven by D3 is formed using four PMOS and four NMOS transistors. The selector driven by D3 of FIG. 14 is formed using two PMOS and four NMOS transistors. Other transistor switch arrangements to form n−1 bit selectors will be readily apparent to those of ordinary skill.

As should now be appreciated, although the disclosed embodiments of decoder 100, 100' make use of PMOS and NMOS transistors/switches, similar decoders embodying the invention may be formed using other p-type/n-type transistors. For example, a decoder using bipolar junction transistors (e.g. PNP/NPN) transistor switches could be formed.

Of course, the above described embodiments are intended to be illustrative only and in no way limiting. The described embodiments of carrying out the invention, are susceptible to many modifications of form, arrangement of parts, details and order of operation. The invention, rather, is intended to encompass all such modification within its scope, as defined by the claims.

The invention claimed is:

1. A method of converting an n-bit digital input signal into an analog output signal, comprising:
   selecting a first analog voltage from analog voltages above a first threshold using a plurality of only p-type transistor switches, in dependence on said n-bit digital input signal;
   selecting a second analog voltage from analog voltages below a second threshold that is above said first threshold, using a plurality of only n-type transistor switches, in dependence on said n-bit digital input signal;
   selecting as said analog output, one of said first analog voltage and said second analog voltage, in dependence on said n-bit digital input signal; and
   periodically varying said analog voltages above said first threshold and said analog voltages below said second threshold, in dependence on a clock signal.

2. The method of claim 1, wherein each of said p-type transistor switches is formed as a PMOS transistor switch, and each of said n-type transistor switches is formed as an NMOS transistor switch.

3. The method of claim 2, wherein each of said p-type transistor switches is formed using a single PMOS transistor, and each of said n-type transistor switches is formed using a single NMOS transistor.

4. The method of claim 2, wherein said first analog voltage and said second analog voltage are each selected using n−1 bits of said n-bit digital input signal.

5. The method of claim 4, wherein one of said first analog voltage and said second analog voltage is selected using one bit of said n-bit digital input signal.

6. The method of claim 5, wherein said analog voltages above said first threshold and said analog voltages below said second threshold are provided using a voltage divider, and wherein voltages applied to said voltage divider are varied in dependence on said clock signal.

7. The method of claim 6, wherein said analog output signal drives an element of a display.

8. A method of converting a digital value into an analog output signal, comprising:
   receiving said digital value as n bits;
   decoding n−1 of said bits using an n−1 bit PMOS decoder formed without NMOS transistors, to provide an analog PMOS decoder output signal having a value above a threshold voltage, said n−1 bit PMOS decoder receiving analog voltages above said threshold;
   decoding n−1 of said bits using an n−1 bit NMOS decoder formed without PMOS transistors, to provide an NMOS decoder output signal, having a value below said threshold, said n−1 bit NMOS decoder receiving analog voltages below said threshold;
   selecting one of said NMOS decoder output, and said PMOS decoder output signals to provide said analog output signal; and
   periodically varying said analog voltages above said threshold; and said analog voltages below said threshold, in dependence on a clock signal.

9. A digital to analog decoder comprising:
   n inputs for receiving an n bit digital input;
   an n−1 bit PMOS decoder formed without NMOS transistors, to decode n−1 of said digital input to provide an analog PMOS decoder output signal having a value above a threshold voltage, said n−1 bit PMOS decoder receiving analog voltages above said threshold;
   an n−1 bit NMOS decoder formed without PMOS transistors, to decode n−1 of said digital input to provide an analog NMOS decoder output signal having a value below said threshold voltage, said n−1 bit NMOS decoder receiving analog voltages below said threshold;
   a selector for selecting one of said NMOS decoder output, and said PMOS decoder output signals to provide said analog output signal;
   wherein said analog voltages above said threshold and said analog voltages below said threshold are periodically varied in dependence on a clock signal.

10. The digital to analog decoder of claim 9, wherein said n−1 bit PMOS decoder comprises $2^n-2$ PMOS transistor switches, and wherein said n−1 bit NMOS decoder, comprises $2^n-2$ NMOS transistor switches.

11. The digital to analog decoder of claim 10, wherein said selector is formed as a PMOS transistor and an NMOS transistor switch.

12. The digital to analog decoder of claim 11 wherein said n−1 bit NMOS decoder comprises a control input to substantially power-down said n−1 bit NMOS decoder, and wherein said n−1 bit PMOS decoder comprises a control input to substantially power-down said n−1 bit PMOS decoder.

13. The digital to analog decoder of claim 12, wherein said control inputs are controlled by one of said n inputs, to substantially power-down the one of said NMOS decoder and said PMOS decoder not providing said analog output signal.

14. A digital to analog decoder comprising p-type transistor and n-type transistor switches:
   n inputs for receiving an n bit digital input;
   a plurality of only p-type transistor switches for selecting a first analog voltage from analog voltages above a first threshold in dependence on said n-bit digital input signal;
   a plurality of only n-type transistor switches for selecting a second analog voltage from analog voltages below a second threshold that is above said first threshold, in dependence on said n-bit digital input signal;
   a selector for selecting one of said first and second analog voltages to provide said analog output signal; and
   periodically varying said analog voltages above said first threshold; and said analog voltages below said second threshold, in dependence on a clock signal.

15. The digital to analog decoder of claim 14 wherein each of said p-type transistor switches is formed as a PMOS transistor switch, and each of said n-type transistor switches is formed as NMOS transistor switch.

16. The digital to analog decoder of claim 15, wherein each of said p-type transistor switches is formed using a single PMOS transistor, and each of said n-type transistor switches is formed using a single NMOS transistor.

17. The digital to analog decoder of claim 16 wherein said selector is formed as a PMOS transistor and an NMOS transistor switch.

18. The digital to analog decoder of claim 14, including $2^n$ analog inputs for receiving said analog voltages above said threshold, and below said threshold.

19. The digital to analog decoder of claim 18, wherein $2^{n-1}$ of said analog inputs are for receiving said analog voltages above said threshold, and $2^{n-1}$ of said analog inputs are for receiving said analog voltages below said threshold.

20. The digital to analog decoder of claim 18 wherein said n-type transistors are interconnected to form an n−1 bit n-type decoder, and further comprising a control input interconnected to at least some of those of said plurality of n-type transistor switches, to prevent analog signals provided to said n−1 bit n-type decoder from propagating through said n-type transistor switches, to an output of said n−1 bit n-type decoder.

21. The digital to analog decoder of claim 20, wherein said n-type transistors are arranged in columns, and wherein said control input turns off those of said n-type transistors in a column receiving 2.sup.n−1 of said analog inputs.

22. The digital to analog decoder of claim 18 wherein said p-type transistors are interconnected to form an n−1 bit p-type decoder, and further comprising a control input interconnected to at least some of those of said plurality of p-type transistor switches, to prevent analog signals provided to said n−1 bit p-type decoder from propagating through said p-type transistor switches, to an output of said n−1 bit p-type decoder.

23. The digital to analog decoder of claim 22, wherein said p-type transistors are arranged in columns, and wherein said control input turns off those of said p-type transistors in a column receiving $2^{n-1}$ of said analog inputs.

24. A digital to analog decoder circuit comprising:
   the digital to analog decoder of claim 18;
   at least one multiplexer to vary analog voltages applied to said analog inputs in alternate cycles of an applied clock.

25. The digital to analog decoder circuit of claim 24, including:
   a resistor network for providing said analog voltages applied to said analog inputs.

26. The digital to analog decoder circuit of claim 25, including:
   a data condition to alter digital data presented to said digital inputs in alternate clock cycles of said applied clock.

27. The digital to analog decoder circuit of claim 26, wherein:
   said data conditioner comprises an inverter for inverting said n bits in alternate clock cycles of said applied clock.

* * * * *